US008692576B2

(12) United States Patent
Heath

(10) Patent No.: US 8,692,576 B2
(45) Date of Patent: Apr. 8, 2014

(54) CIRCUIT AND METHODOLOGY FOR HIGH-SPEED, LOW-POWER LEVEL SHIFTING

(75) Inventor: Jeffrey Lynn Heath, Santa Barbara, CA (US)

(73) Assignee: Linear Technology Corporation, Milpitas, CA (US)

( * ) Notice: Subject to any disclaimer, the term of this patent is extended or adjusted under 35 U.S.C. 154(b) by 1604 days.

(21) Appl. No.: 11/522,408

(22) Filed: Sep. 18, 2006

(65) Prior Publication Data

US 2008/0122486 A1 May 29, 2008

(51) Int. Cl.
*H03K 19/0175* (2006.01)

(52) U.S. Cl.
USPC .................. 326/80; 326/68; 326/83; 326/115

(58) Field of Classification Search
USPC .................................... 326/62–64, 68, 80, 81
See application file for complete search history.

(56) References Cited

U.S. PATENT DOCUMENTS

| | | | |
|---|---|---|---|
| 4,629,913 A | | 12/1986 | Lechner |
| 5,479,132 A | * | 12/1995 | Verhaeghe et al. ............ 327/553 |
| 5,781,026 A | * | 7/1998 | Chow ............................... 326/26 |
| 6,008,667 A | * | 12/1999 | Fahrenbruch .................. 326/66 |
| 6,424,217 B1 | | 7/2002 | Kwong |
| 6,734,704 B1 | * | 5/2004 | Burkland ........................ 326/63 |
| 2006/0001447 A1 | | 1/2006 | De Langen et al. |
| 2006/0186923 A1 | | 8/2006 | Wang |
| 2007/0008001 A1 | * | 1/2007 | Sanchez et al. ................ 326/80 |

FOREIGN PATENT DOCUMENTS

| | | |
|---|---|---|
| EP | 0 575 676 A1 | 12/1993 |
| WO | WO 2004047297 A1 * | 6/2004 |

OTHER PUBLICATIONS

International Preliminary Report on Patentability and Written Opinion issued in corresponding International Patent Application No. PCT/US2006/048197, mailed Jul. 3, 2007.
European Office Action issued in European Patent Application No. EP 06 845 700.1 dated Dec. 10, 2009.
Office Action issued in Chinese Application No. 200680055871.1 dated Mar. 1, 2013.
Office Action issued in Chinese Application No. 200680055871.7 dated Mar. 1, 2013.
Chinese Office Action, w/ English translation thereof, issued in Chinese Patent Application No. CN 200680055871.7 dated Jan. 10, 2011.
English translation of Office Action issued in Chinese Patent Application No. 200680055871.7, dated Sep. 15, 2011.

* cited by examiner

*Primary Examiner* — Jany Richardson
(74) *Attorney, Agent, or Firm* — McDermott Will & Emery LLP

(57) ABSTRACT

A level shifting circuit and methodology involving a switching current generator responsive to switching of an input signal for producing a switching current to switch an output signal, and a holding current generator for producing a holding current to hold the logic level of the output signal in accordance with the logic level of the input signal. The holding current is produced independently of the switching current.

21 Claims, 3 Drawing Sheets

CIRCUIT AND METHODOLOGY FOR HIGH-SPEED, LOW-POWER LEVEL SHIFTING

TECHNICAL FIELD

This disclosure relates to electronic circuits, and more particularly, to a level shifter and methodology for changing a voltage level of a logic signal at an interface between systems operating in different logic voltage domains.

BACKGROUND ART

Many circuits, including BiCMOS integrated circuits, must pass clocks, logic control and status signals between circuits operating at different voltage values of logic levels. These circuits are commonly called logic shifters. When two circuits operating in different logic voltage domains share a common voltage rail, e.g. a common ground or return voltage rail, it is relatively easy to provide a high-speed, low-power level shifter between them.

However, this problem becomes significantly more difficult when each of the circuits has a pair of voltage rails, and none of these rails is shared with the other circuit. When voltage levels of one pair of voltage rails moves with respect to a voltage level of the other pair, the logic level at the output of the level shifter may change with respect to the logic level at its input. In a conventional high-speed level shifter, a high power is consumed in a steady mode to hold the logic level constant. Therefore, it would be desirable to provide a high-speed, low-power level shifter for supporting operations of a system having at least two pairs of power supply rails.

SUMMARY OF THE DISCLOSURE

The present disclosure offers a novel level shifting circuit having a switching current generator responsive to switching of an input logic signal for producing a switching current to switch an output logic signal, and a holding current generator for producing a holding current to hold a logic level of the output signal in accordance with a logic level of the input signal. The holding current is produced independently of the switching current.

In accordance with one aspect of the disclosure, the level shifter supports level shifting between circuits, each of which has a pair of voltage rails. In particular, the input signal may have a first logic level at a first voltage value and second logic level at a second voltage value, and the output signal may have the first logic level at a third voltage value and the second logic level at a fourth voltage value, where the first, second, third and fourth voltage values differ from each other.

In accordance with an embodiment of the disclosure, the switching current generator may comprise a first current pulse generator for producing a first current pulse, and a second current pulse generator for producing a second current pulse having a polarity opposite with respect to the first current pulse. A differential current sensor may be provided for switching the output signal in response to the first and second current pulses.

The differential current sensor may include a first current mirror responsive to the first current pulse, second current mirror responsive to the second current pulse, and a third current mirror responsive to signals produced by the first and second current mirrors. An output sensor, such as a Schmitt trigger, coupled to the third current mirror may produce the output signal.

The holding current generator may supply the holding current to the first and second current pulse generators for augmenting one of the first and second current pulses.

The first current pulse generator may include a first inverter responsive to the input signal, and a first capacitance element coupled between the output of the first inverter and the first current mirror. The second current pulse generator may comprise a second inverter connected to the output of the first inverter and a second capacitance element coupled between the output of the second inverter and the second current mirror.

A first switch controlled by the output signal of the first inverter may be connected between the holding current generator and the first current mirror. A second switch controlled by the output signal of the second inverter may be connected between the holding current generator and the second current mirror.

The switching current generator is provided with voltage values produced by the voltage rails corresponding to the input signal, whereas the differential current sensor is supplied with voltage values produced by the voltage rails corresponding to the output signal.

If the voltage value corresponding to a high logic level of the input signal is lower than the voltage value corresponding to a high logic level of the output signal, i.e. when the level shifter passes a signal from a circuit with a lower voltage level to a circuit with a higher voltage level, the first and second switches of the current pulse generators comprise P-type field-effect devices. However, when the level shifter passes a signal from a circuit with a higher voltage level to a circuit with a lower voltage level, the first and second switches of the current pulse generators comprise N-type field-effect devices.

In accordance with another aspect of the disclosure, a system for transferring a logic signal between circuits that do not share a voltage rail, comprises a switching signal generator for producing a switching signal to change a logic level of an output signal in response to a change in a logic level of an input signal, and a holding signal generator for producing a holding signal independently of the switching signal to hold the logic level of the output signal in accordance with the logic level of the input signal.

In accordance with a method of the present disclosure, the following steps are carried out to provide level shifting:
producing a switching signal to change a logic level of the output signal in response to a change in a logic level of the input signal, and
producing a holding signal independently of the switching signal to hold the logic level of the output signal in accordance with the logic level of the input signal.

Additional advantages and aspects of the disclosure will become readily apparent to those skilled in the art from the following detailed description, wherein embodiments of the present disclosure are shown and described, simply by way of illustration of the best mode contemplated for practicing the present disclosure. As will be described, the disclosure is capable of other and different embodiments, and its several details are susceptible of modification in various obvious respects, all without departing from the spirit of the disclosure. Accordingly, the drawings and description are to be regarded as illustrative in nature, and not as limitative.

BRIEF DESCRIPTION OF THE DRAWINGS

The following detailed description of the embodiments of the present disclosure can best be understood when read in conjunction with the following drawings, in which the features are not necessarily drawn to scale but rather are drawn as to best illustrate the pertinent features, wherein.

DETAILED DISCLOSURE OF THE EMBODIMENTS

Figure 1:
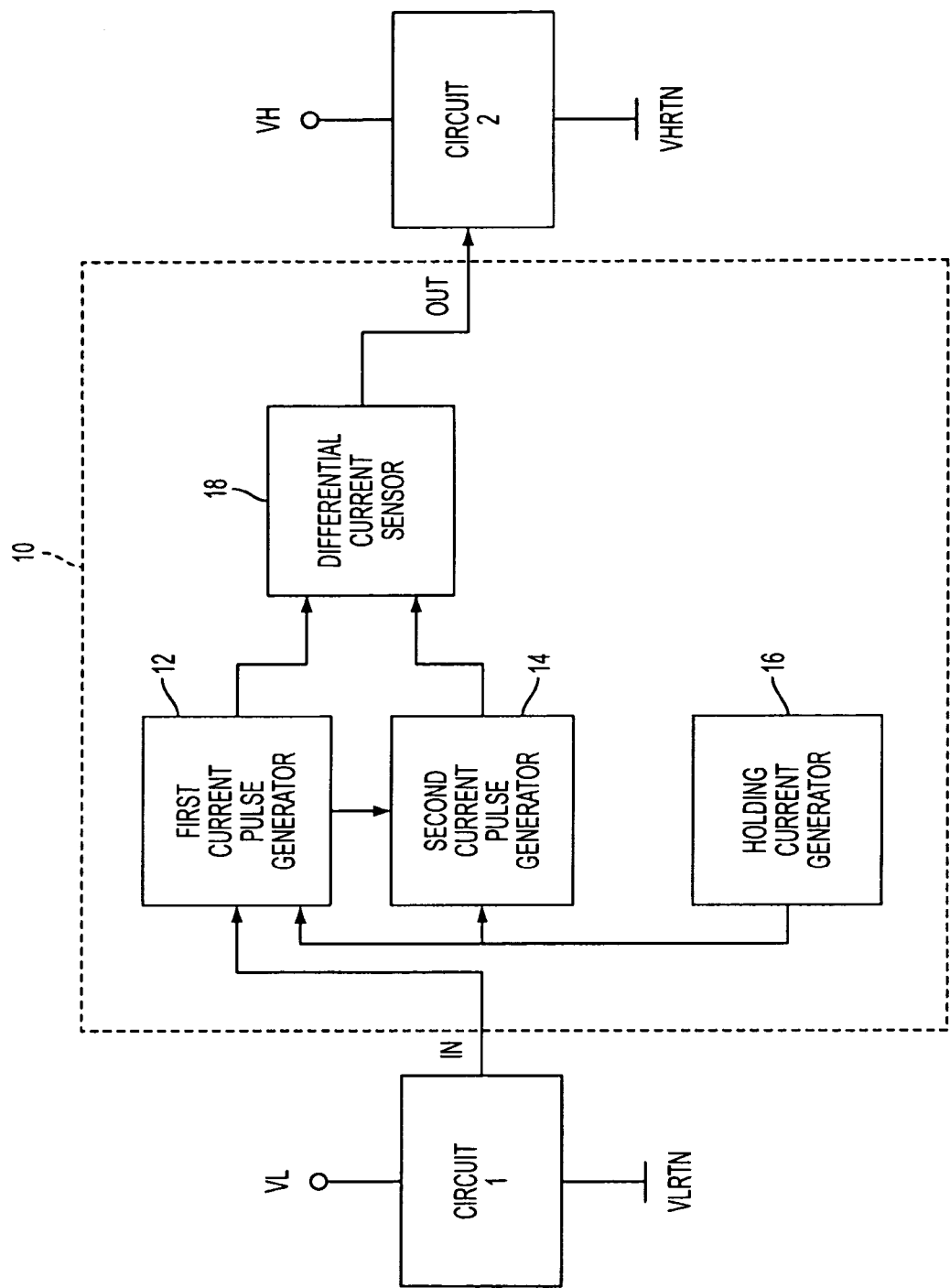
FIG. 1 is a simplified block diagram illustrating operations performed by a level shifter of the present disclosure.

FIG. 1 is a simplified block diagram illustrating operations performed by a level shifter 10 of the present disclosure that may provide level shifting of a logic signal supplied from a circuit 1 having a voltage rail VL and a return voltage rail VLRTN, to a circuit 2 having a voltage rail VH and a return voltage rail VHRTN. Levels of voltages VL, VLRTN, VH and VHRTN supplied by the respective voltage rails may differ from each other. Accordingly, the level shifter 10 may support the interface between the circuits 1 and 2 that do not share any common voltage rail.

An input logic signal IN supplied from the circuit 1 to the level shifter 10 may have a first logic level, e.g. a high logic level, defined by the voltage level VL and a second logic level, e.g. a low logic level, corresponding to the voltage level VLRTN. An output logic signal OUT supplied from the level shifter 10 to the circuit 2 may have a first logic level, e.g. a high logic level, defined by the voltage level VH and a second logic level, e.g. a low logic level, corresponding to the voltage level VHRTN.

The level shifter 10 may include a pair of current pulse generators 12 and 14, a holding current generator 16, and a differential current sensor 18. When the input logic signal IN switches from one of its logic levels to the other, the current pulse generators 12 and 14 produce a pair of switching current pulses having opposite polarity to provide switching of the output logic signal OUT in response to the input signal switching. For example, when the IN signal goes from its low logic level to its high logic level, the switching current pulses produced by the current pulse generators 12 and 14 provide switching of the OUT signal from its low logic level to its high logic level.

The holding current generator 16 produces a holding current to hold a logic level of the output signal OUT consistent with a logic level of the input signal IN, e.g. the holding current prevents the output signal OUT from moving to a low logic level when the IN signal remains at a high logic level. In a steady state, the holding current holds the logic level constant, even if the VH and VHRTN voltage levels move with respect to the VLRTN voltage levels. The holding current generator 16 may be configured for producing a desired value of the holding current for any arbitrary rate of change in the voltage difference between VH, VHRTN, and VLRTN. The holding current may be supplied to the current pulse generators 12 and 14. In response to a pair of opposite polarity current pulses produced by the current pulse generators 12 and 14, the differential current sensor 18 provides switching of the output signal OUT.

Although the holding current participates in the signal switching, it's main function is to hold the logic level of the output signal. This function requires much less power than providing the switching current that determines the switching speed of the level shifter 10. In accordance with the present disclosure, the holding current is produced independently of the switching current to separate the function of holding the logic level from the function of signal switching. As a result, the circuit designer is enabled to separately select a switching speed and a quiescent power of the circuit.

The switching speed is determined by the switching current and may be selected by adjusting the current pulse generators 12 and 14. The quiescent power depends on the holding current that determines the power supply noise rejection of the circuit. Therefore, even when the switching current is made large to provide a high switching speed, the holding current may be produced at a minimum level sufficient to hold the logic level. Hence, the designer is enabled to create a high-speed level shifter with a low power consumption.

Figure 2:
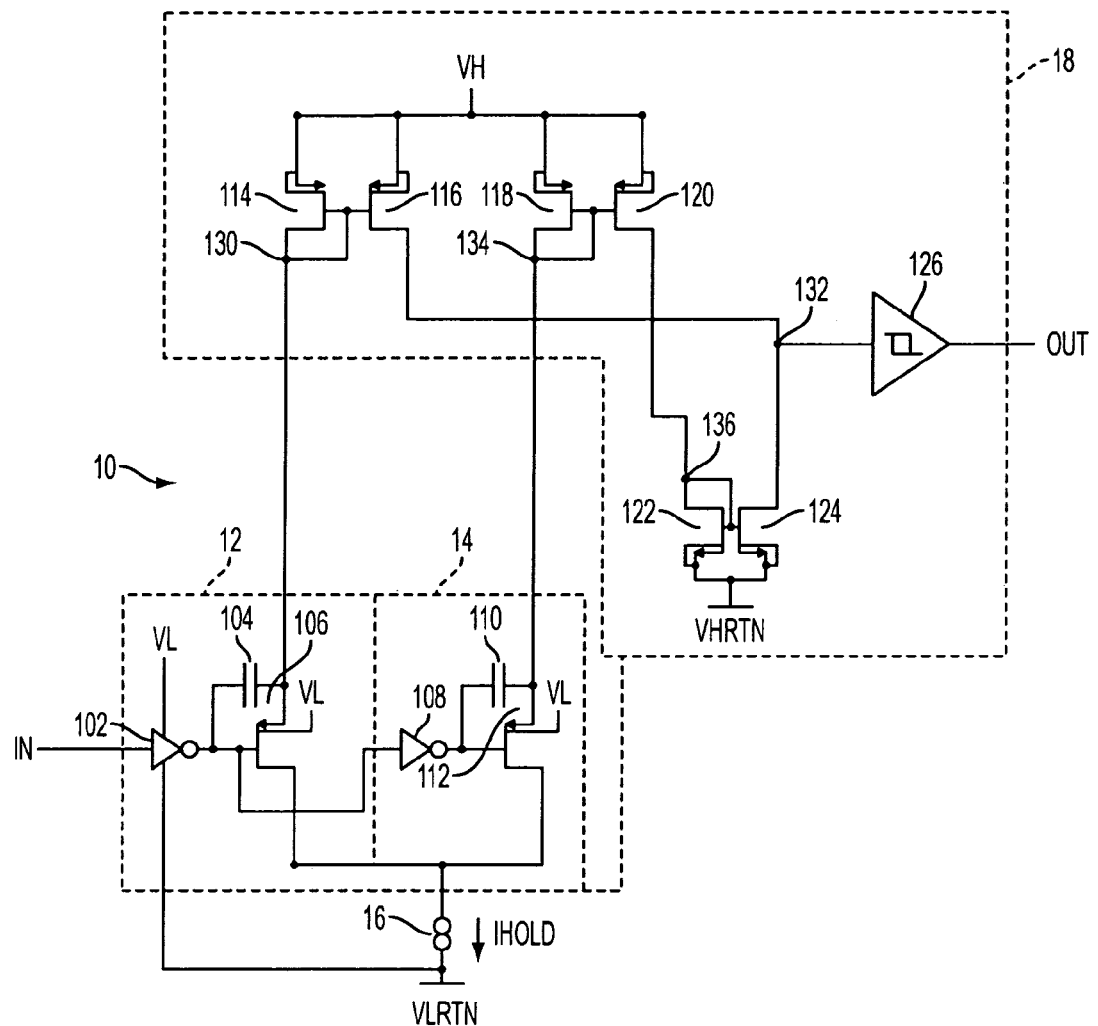
FIG. 2 illustrates an exemplary embodiment of the level shifter for providing level shifting from a lower voltage level to a higher voltage level.

The input logic signal IN of the level shifter 10 may have a voltage level lower or higher than the output logic signal OUT. FIG. 2 illustrates an exemplary embodiment of the level shifter 10 for providing level shifting from a lower voltage level defined by the voltage rails VL and VLRTN to a higher voltage level defined by the voltage rails VH and VHRTN. The first current pulse generator 12 may include an inverter 102 for receiving the input signal IN, a capacitor 104 coupled to the inverter 102 and a switch 106, such as an P-type MOSFET, controlled by the output of the inverter 102. The second current pulse generator 14 may include an inverter 108 coupled to the output of the inverter 102, a capacitor 110 coupled to the inverter 108 and a switch 112, such as an P-type MOSFET, controlled by the output of the inverter 108. The holding current generator 16 may include a current source $I_{HOLD}$ for producing a holding current. The current source $I_{HOLD}$ may be connected to the switches 106 and 112.

The differential current sensor 18 may include a first current mirror composed of switches 114 and 116, such as P-type MOSFETs, a second current mirror composed of switches 118 and 120, such as P-type MOSFETs, a third current mirror composed of switches 122 and 124, such as N-type MOSFETs, and an output sensor 126, such as a Schmitt trigger. The first current mirror is connected to the output of the first current pulse generator, and the second current mirror is coupled to the output of the second current pulse generator. The third current mirror is provided at the outputs of the first and second current mirrors. The output sensor 126 is connected to the third current mirror to output the signal OUT. One skilled in the art would recognize that bipolar transistors may be utilized instead of MOSFETs to perform operations of the current mirrors and current pulse generators. Also, the output sensor 126 may be implemented using any appropriate output driving arrangement instead of the Schmitt trigger.

The voltage rails VL and VLRTN may supply power to elements of the current pulse generators 12 and 14 and the holding current generator 16. The voltage rails VH and VHRTN may supply power to elements of the differential current sensor 18.

For example, when the IN signal goes from a low logic level corresponding to the VLRTN voltage to a high logic level corresponding to the VL voltage, it is buffered and inverted by the inverter 102, which pulls down its output signal supplied to the capacitor 104. The output signal of the inverter 102 turns on the transistor 106 having some parasitic capacitance associated with its gate. This parasitic capacitance enhances the effect of the capacitor 104 that applies a large negative charge pulse to node 130 causing current to flow in the transistor 114. The negative current pulse overcomes any parasitic capacitance on the node 130 associated with the gate capacitance of the transistors 114 and 116. The negative current pulse produced by the current pulse generator 12 is augmented by the holding current $I_{HOLD}$ from the holding current generator 16. Current substantially larger than the holding current $I_{HOLD}$ flows in the transistor 114 and is mirrored in the transistor 116. The current from transistor 116 pulls up on node 132.

At nearly the same time when the output signal of the inverter 102 goes down in response to a high logic level of the IN signal, the output signal of the inverter 108 goes high. This causes a positive charge pulse at node 134. Also, the transistor 112 stops conducting the holding current $I_{HOLD}$. The parasitic gate capacitance of the transistor 112 also contributes to producing the positive charge pulse at the node 134 that quickly turns off the transistors 118 and 120. With no current in node 136, the transistors 122 and 124 turn off.

The strong pull up current at node 132 and termination of the pull down current by the transistor 124 causes the node 132 to quickly pull up. This transition is detected by the Schmitt trigger 126 that causes the output signal OUT to go high from the VHRTN voltage to the VH voltage. When the IN signal goes from a high logic level to a low logic level, a symmetrical and inverse process occurs, causing the OUT signal to go low.

The arrangement in FIG. 2 enables the designer to separate the switching function of the level shifter from its holding function. For example, while the switching speed may be increased by adjusting values of the capacitors 104 and 110, the designer may kept the holding current at a minimum level sufficient to hold the logic level constant, in order to provide a low quiescent power.

Figure 3:
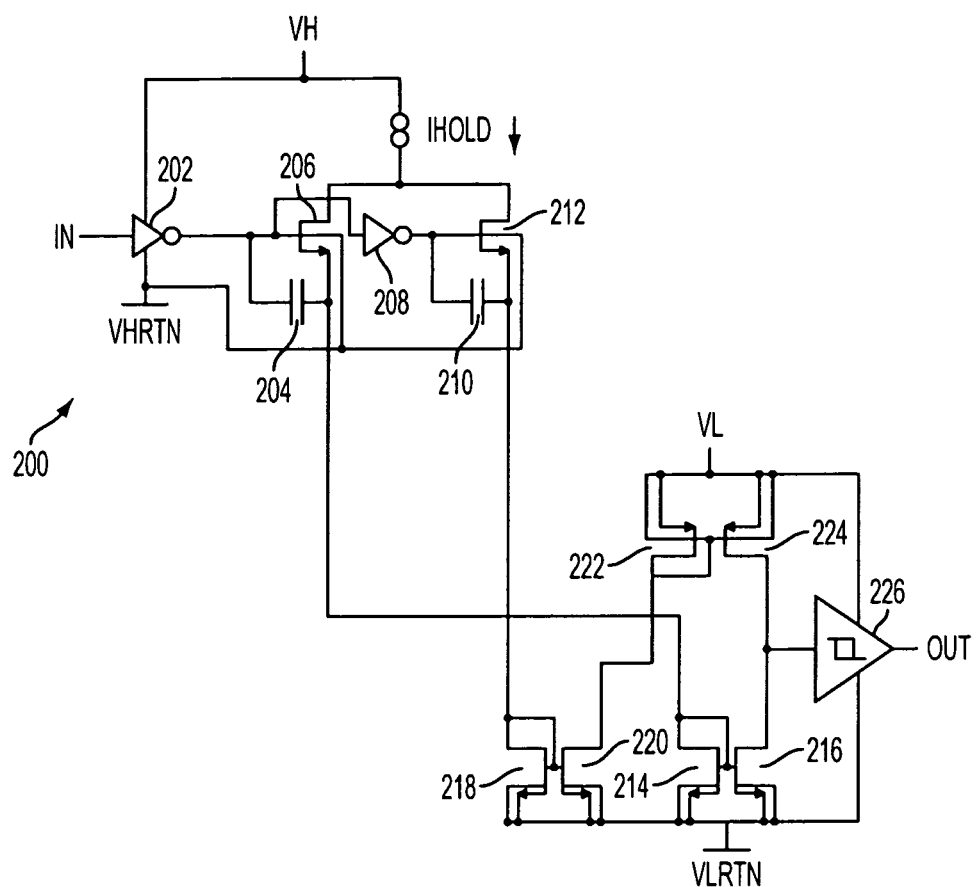
FIG. 3 illustrates an exemplary embodiment of the level shifter for providing level shifting from a higher voltage level to a lower voltage level.

FIG. 3 illustrates an exemplary embodiment of a level shifter 200 for providing level shifting of a logic signal from a higher voltage level defined by the voltage rails VH and VHRTN to a lower voltage level defined by the voltage rails VL and VLRTN. Similarly to the embodiment shown in FIG. 2, the level shifter 200 may include a pair of current pulse generators for producing switching current pulses having opposite polarities, a holding current generator and a differential current sensor.

The first current pulse generator may have an inverter 202 for receiving the input signal IN, a capacitor 204 coupled to the inverter 202 and a switch 206, controlled by the output of the inverter 102. The second current pulse generator may include an inverter 208 coupled to the output of the inverter 202, a capacitor 210 coupled to the inverter 208 and a switch 212, controlled by the output of the inverter 108. By contrast with the current pulse generators in FIG. 2, the switches 206 and 212 may be implemented using N-type MOSFETs. The holding current generator may have a current source $I_{HOLD}$ for producing a holding current. The current source $I_{HOLD}$ may be connected to the switches 206 and 212.

The differential current sensor may include a first current mirror composed of switches 214 and 216, such as N-type MOSFETs, a second current mirror composed of switches 218 and 220, such as N-type MOSFETs, a third current mirror composed of switches 222 and 224, such as P-type MOSFETs, and an output sensor 226, such as a Schmitt trigger. The first current mirror is connected to the output of the first current pulse generator, and the second current mirror is coupled to the output of the second current pulse generator. The third current mirror is provided at the outputs of the first and second current mirrors. The output sensor 226 is connected to the third current mirror to output the signal OUT. The voltage levels VH and VHRTN may be supplies to elements of the current pulse generators and the holding current generator, whereas the voltage levels VL and VLRTN may be provided to elements of the differential current sensor 18.

Operation of the level shifter 200 is similar to the operation of the level shifter 10 in FIG. 2. When the input logic signal IN switches from one of its logic levels to the other, the current pulse generators produce a pair of opposite polarity current pulses to provide respective switching of the output logic signal OUT. The holding current generator produces a holding current $I_{HOLD}$ to hold a logic level of the output signal OUT consistent with a logic level of the input signal IN. As the holding current is produced independently of the switching current, the circuit designer is enabled to separately select a switching current that determines the switching speed of the circuit, and a holding current that determines the quiescent power. The switching speed may be increased by adjusting values of the capacitors 204 and 210. The quiescent power may be kept at a minimum level by selecting a minimum value of the holding current sufficient to hold the logic level constant. As a result, a high-speed level shifter with a low power consumption may be provided.

The foregoing description illustrates and describes aspects of the present invention. Additionally, the disclosure shows and describes only preferred embodiments, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention.

Accordingly, the description is not intended to limit the invention to the form disclosed herein. Also, it is intended that the appended claims be construed to include alternative embodiments.

What is claimed is:

1. A level shifting circuit for producing an output signal at a logic level having a different voltage value compared to a corresponding logic level of an input signal, comprising:
   a switching current generator responsive to switching of the input signal for producing a switching current to switch the output signal, and
   a holding current generator for producing a holding current to hold a logic level of the output signal in accordance with a logic level of the input signal,
   the holding current generator being configured for producing the holding current independently of the switching current.

2. The circuit of claim 1, wherein the input signal has a first logic level at a first voltage value and second logic level at a second voltage value, and the output signal has the first logic level at a third voltage value and the second logic level at a fourth voltage value, where the first, second, third and fourth voltage values differ from each other.

3. The circuit of claim 2, wherein the switching current generator comprises a first current pulse generator for producing a first current pulse, and a second current pulse generator for producing a second current pulse having a polarity opposite with respect to the first current pulse.

4. The circuit of claim 3, further comprising a differential current sensor responsive to the first and second current pulses for switching the output signal.

5. The circuit of claim 4, wherein the differential current sensor includes:
   a first current mirror responsive to the first current pulse,
   a second current mirror responsive to the second current pulse, and a third current mirror responsive to signals produced by the first and second current mirrors.

6. The circuit of claim 5, wherein the differential current sensor further comprises an output sensor coupled to the third current mirror for producing the output signal.

7. The circuit of claim 6, wherein the output current sensor includes a Schmitt trigger.

8. The circuit of claim 6, wherein the output current sensor includes a comparison circuit for comparing with a voltage threshold.

9. The circuit of claim 3, wherein the holding current generator is configured to supply the holding current to the first and second current pulse generators for augmenting one of the first and second current pulses.

10. The circuit of claim 6, wherein the first current pulse generator comprises a first inverter responsive to the input signal, and a first capacitance element coupled between the output of the first inverter and the first current mirror.

11. The circuit of claim 10, wherein the second current pulse generator comprises a second inverter connected to the output of the first inverter and a second capacitance element coupled between the output of the second inverter and the second current mirror.

12. The circuit of claim 11, wherein the first current pulse generator further comprises a first switch connected between the holding current generator and the first current mirror and controlled by the output signal of the first inverter.

13. The circuit of claim 12, wherein the second current pulse generator further comprises a second switch connected between the holding current generator and the second current mirror and controlled by the output signal of the second inverter.

14. The circuit of claim 13, wherein the input signal has a high logic level corresponding to the first voltage value and a low logic level corresponding to the second voltage value, and the output signal has a high logic level corresponding to the third voltage value and a low logic level corresponding to the fourth voltage value.

15. The circuit of claim 14, wherein the switching current generator is supplied by the first and second voltage values, and the differential current sensor is supplied by the third and fourth voltage values.

16. The circuit of claim 15, wherein the first voltage value is lower than the third voltage value.

17. The circuit of claim 16, wherein the first and second switches comprise P-type field-effect devices.

18. The circuit of claim 15, wherein the first voltage value is higher than the third voltage value.

19. The circuit of claim 18, wherein the first and second switches comprise N-type field-effect devices.

20. A method of level shifting to produce an output signal at a logic level having a different voltage value compared to a corresponding logic level of an input signal, comprising the steps of:
producing a switching signal to change a logic level of the output signal in response to a change in a logic level of the input signal, and
producing a holding signal independently of the switching signal to hold the logic level of the output signal in accordance with the logic level of the input signal.

21. A system for transferring a logic signal between circuits that do not share a voltage rail, comprising:
a switching signal generator for producing a switching signal to change a logic level of an output signal in response to a change in a logic level of an input signal, and
a holding signal generator for producing a holding signal independently of the switching signal to hold the logic level of the output signal in accordance with the logic level of the input signal.

* * * * *